(12) United States Patent
Schubert et al.

(10) Patent No.: US 10,243,120 B2
(45) Date of Patent: Mar. 26, 2019

(54) SOLID STATE LIGHTING DEVICES HAVING IMPROVED COLOR UNIFORMITY AND ASSOCIATED METHODS

(71) Applicant: Micron Technology, Inc., Boise, ID (US)

(72) Inventors: Martin F. Schubert, Mountain View, CA (US); Kevin Tetz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/982,330

(22) Filed: May 17, 2018

(65) Prior Publication Data

US 2018/0269365 A1    Sep. 20, 2018

Related U.S. Application Data

(60) Division of application No. 14/684,192, filed on Apr. 10, 2015, now Pat. No. 10,002,994, which is a
(Continued)

(51) Int. Cl.
*H01L 33/00* (2010.01)
*H01L 33/50* (2010.01)
(Continued)

(52) U.S. Cl.
CPC ............ *H01L 33/58* (2013.01); *H01L 33/007* (2013.01); *H01L 33/0095* (2013.01);
(Continued)

(58) Field of Classification Search
CPC ..... H01L 33/58; H01L 33/0095; H01L 33/50; H01L 33/007; H01L 33/54;
(Continued)

(56) References Cited

U.S. PATENT DOCUMENTS 2,073,300 A * 3/1937 Frederick ............... G02B 5/126
                                                    359/543
2,220,145 A    11/1940 Cooke et al.
(Continued)

FOREIGN PATENT DOCUMENTS

JP    2008243959 A    10/2008
JP    2011077214 A     4/2011
(Continued)

OTHER PUBLICATIONS

Office Action dated Jul. 25, 2014 in Taiwan Application No. 101113835, 23 pages.
(Continued)

*Primary Examiner* — Galina G Yushina
(74) *Attorney, Agent, or Firm* — Perkins Coie LLP

(57) ABSTRACT

Solid state lighting (SSL) devices and methods of manufacturing SSL devices are disclosed herein. In one embodiment, an SSL device comprises a support having a surface and a solid state emitter (SSE) at the surface of the support. The SSE can emit a first light propagating along a plurality of first vectors. The SSL device can further include a converter material over at least a portion of the SSE. The converter material can emit a second light propagating along a plurality of second vectors. Additionally, the SSL device can include a lens over the SSE and the converter material. The lens can include a plurality of diffusion features that change the direction of the first light and the second light such that the first and second lights blend together as they exit the lens. The SSL device can emit a substantially uniform color of light.

5 Claims, 9 Drawing Sheets

Related U.S. Application Data continuation of application No. 13/092,669, filed on Apr. 22, 2011, now Pat. No. 9,029,887.

(51) Int. Cl.
  *H01L 33/54* (2010.01)
  *H01L 33/58* (2010.01)
  *H01L 51/52* (2006.01)
  *H01L 25/075* (2006.01)

(52) U.S. Cl.
  CPC .......... *H01L 33/50* (2013.01); *H01L 51/5275* (2013.01); *H01L 25/0753* (2013.01); *H01L 33/54* (2013.01); *H01L 2924/0002* (2013.01); *H01L 2933/0083* (2013.01)

(58) Field of Classification Search
  CPC ............. H01L 51/5275; H01L 25/0753; H01L 2924/0002; H01L 2933/0083
  See application file for complete search history.

(56) References Cited

U.S. PATENT DOCUMENTS

| | | | |
|---|---|---|---|
| 5,841,154 | A | 11/1998 | Uchio et al. |
| 5,944,405 | A | 8/1999 | Takeuchi et al. |
| 6,195,058 | B1 | 2/2001 | Nakamura et al. |
| 6,576,488 | B2 | 6/2003 | Collins, III et al. |
| 6,583,936 | B1 | 6/2003 | Kaminsky et al. |
| 6,653,765 | B1 | 11/2003 | Levinson et al. |
| 6,682,331 | B1 | 1/2004 | Peh et al. |
| 7,344,902 | B2 | 3/2008 | Basin et al. |
| 7,352,011 | B2 | 4/2008 | Smits et al. |
| 7,452,737 | B2 | 11/2008 | Basin et al. |
| 7,821,023 | B2 | 10/2010 | Yuan et al. |
| 7,993,035 | B2 | 8/2011 | Shih et al. |
| 8,110,842 | B2 | 2/2012 | Weng et al. |
| 9,029,887 | B2 | 5/2015 | Schubert et al. |
| 2002/0015314 | A1 | 2/2002 | Umemoto et al. |
| 2003/0080189 | A1 | 5/2003 | Patel et al. |
| 2004/0114229 | A1 | 6/2004 | Sakaguchi et al. |
| 2006/0043391 | A1* | 3/2006 | Erchak .................. B82Y 20/00 257/82 |
| 2006/0072319 | A1 | 4/2006 | Dziekan et al. |
| 2006/0102914 | A1* | 5/2006 | Smits .................. H01L 33/54 257/98 |
| 2006/0105484 | A1* | 5/2006 | Basin .................. B29C 39/006 438/27 |
| 2007/0108463 | A1 | 5/2007 | Chua et al. |
| 2007/0152848 | A1 | 7/2007 | Dutton |
| 2008/0048200 | A1 | 2/2008 | Mueller et al. |
| 2008/0204910 | A1 | 8/2008 | Chiang et al. |
| 2008/0205035 | A1 | 8/2008 | Asvadi et al. |
| 2008/0273027 | A1 | 11/2008 | Feremans et al. |
| 2009/0015548 | A1* | 1/2009 | Tazaki .................. G06F 3/0308 345/156 |
| 2009/0294788 | A1 | 12/2009 | Rosler et al. |
| 2009/0321759 | A1 | 12/2009 | Xu |
| 2010/0072488 | A1 | 3/2010 | Bierhuizen et al. |
| 2010/0079701 | A1* | 4/2010 | Murayama .......... G02B 5/0226 349/64 |
| 2010/0117517 | A1 | 5/2010 | Cok et al. |
| 2010/0135043 | A1* | 6/2010 | Wang .................. G02B 6/0016 362/628 |
| 2010/0213480 | A1 | 8/2010 | Jung et al. |
| 2010/0263723 | A1 | 10/2010 | Allen et al. |
| 2011/0001151 | A1 | 1/2011 | Le Toquin |
| 2011/0013116 | A1 | 1/2011 | Matsuki et al. |
| 2011/0031516 | A1 | 2/2011 | Basin et al. |
| 2011/0114979 | A1 | 5/2011 | Jang |
| 2012/0267650 | A1 | 10/2012 | Schubert et al. |
| 2015/0287895 | A1 | 10/2015 | Schubert et al. |

FOREIGN PATENT DOCUMENTS

| | | |
|---|---|---|
| TW | 200405590 A | 4/2004 |
| TW | 200633264 A | 9/2006 |
| TW | 200705336 A | 2/2007 |
| TW | 200847465 A | 12/2008 |
| TW | 200950160 A | 12/2009 |

OTHER PUBLICATIONS

Office Action dated May 5, 2015 in Taiwan Application No. 101113835, 25 pages.

"International Search Report and Written Opinion dated Sep. 27, 2012 in International Application No. PCT/US2012/034113, 7 pages."

"Wang, K. et al., Angular color uniformity enhancement of white light-emitting diodes integrated with freeform lenses, Optics Letters, vol. 35, No. 11, pp. 1860-1862, Jun. 1, 2010."

* cited by examiner

SOLID STATE LIGHTING DEVICES HAVING IMPROVED COLOR UNIFORMITY AND ASSOCIATED METHODS

CROSS-REFERENCE TO RELATED APPLICATIONS

This application is a divisional of U.S. patent application Ser. No. 14/684,192, filed Apr. 10, 2015, which is a continuation of U.S. patent application Ser. No. 13/092,669, filed Apr. 22, 2011, now U.S. Pat. No. 9,029,887, each of which is incorporated herein by reference in its entirety.

TECHNICAL FIELD

The present technology is related to solid state lighting ("SSL") devices and associated methods of manufacturing SSL devices. In particular, the present technology is related to SSL devices having lenses that improve color uniformity across the SSL device and associated methods.

BACKGROUND

Solid state lighting ("SSL") devices generally use solid state emitters ("SSEs") such as semiconductor light-emitting diodes ("LEDs"), organic light-emitting diodes ("OLEDs"), and/or polymer light-emitting diodes ("PLEDs") as sources of illumination rather than electrical filaments, plasma, or gas. A conventional type of SSL device has a "white light" SSE. White light requires a mixture of wavelengths to be perceived by human eyes. However, SSEs typically only emit light at one particular wavelength (e.g., blue light), so SSEs are modified to generate white light. One conventional technique for modulating the light from SSEs includes depositing a converter material (e.g., phosphor) on the SSE. For example, FIG. 1 shows a conventional SSL device 10 that includes a support 2, an SSE 4 attached to the support 2, and a converter material 6 on the SSE 4. The SSE 4 emits light (e.g., blue light) radially outward along a plurality of first vectors 8. The converter material 6 scatters some of the light emitted by the SSE 4 and absorbs other light emitted by the SSE 4. The absorbed light causes the converter material 6 to emit light of a different color along a plurality of second vectors 12. The light from the converter material along the second vectors 12 can have a desired frequency (e.g., yellow light) such that the combination of light along the first and second vectors 8 and 12 appears white to human eyes if the wavelengths and amplitudes of the emissions are matched appropriately.

One challenge associated with conventional SSL devices (e.g., the SSL device 10 shown in FIG. 1) is that the color of light generally varies across the SSL devices due to the emission angle. As shown in FIG. 1, when the SSE 4 is treated as a point source, the emission angle θ is the angle that light (e.g., along the first vectors 8) projects away from an axis N normal to the support 2. The distance light travels through the converter material 6 accordingly changes as a function of the emission angle θ. As shown in FIG. 1, for example, the first vectors 8 having greater emission angles θ (e.g., 60°) travel greater distances through the converter material 6 than the first vectors 8 having smaller emission angles θ (e.g., 10°). The longer a first vector 8 travels through the converter material 6, the more light from the SSE 4 the converter material 6 absorbs, and the more light the converter material 6 generates. As a result, light with a large emission angle θ and thereby a longer path through the converter material 6 includes less blue light from the SSE 4 and generates more yellow light from the converter material 6. Conversely, light with a small emission angle θ and thereby a shorter path through the converter material 6 includes more blue light from the SSE 4 and generates less yellow light from the converter material 6. Therefore, when viewed head-on, the color of light emitted by the SSL device 10 may appear more bluish, and when viewed from the side, the color of light may appear more yellowish. Accordingly, the emission angle θ of the light can result in color variance across the viewing angle of the SSL device 10.

DETAILED DESCRIPTION

Specific details of several embodiments of solid state lighting ("SSL") devices and associated methods of manufacturing SSL devices are described below. The term "SSL" generally refers to "solid state light" and/or "solid state lighting" according to the context in which it is used. The term "SSE" generally refers to solid state components that convert electrical energy into electromagnetic radiation in the visible, ultraviolet, infrared, and/or other spectra. SSEs include semiconductor light-emitting diodes ("LEDs"), polymer light-emitting diodes ("PLEDs"), organic light-emitting diodes ("OLEDs"), or other types of solid state devices that convert electrical energy into electromagnetic radiation in a desired spectrum. The term "phosphor" generally refers to a material that can continue emitting light after exposure to energy (e.g., electrons and/or photons). Additionally, the term "lens" generally refers to a material (e.g., a transparent encapsulant) that can emit light through its exterior surface. Packaged SSL devices and methods of manufacturing SSL assemblies are specifically described below to provide an enabling disclosure, but the package and methods can be applied to any SSL device. A person skilled in the relevant art will understand that the new technology may have additional embodiments and that the new technology may be practiced without several of the details of the embodiments described below with reference to FIGS. 2A-9.

Figure 1:
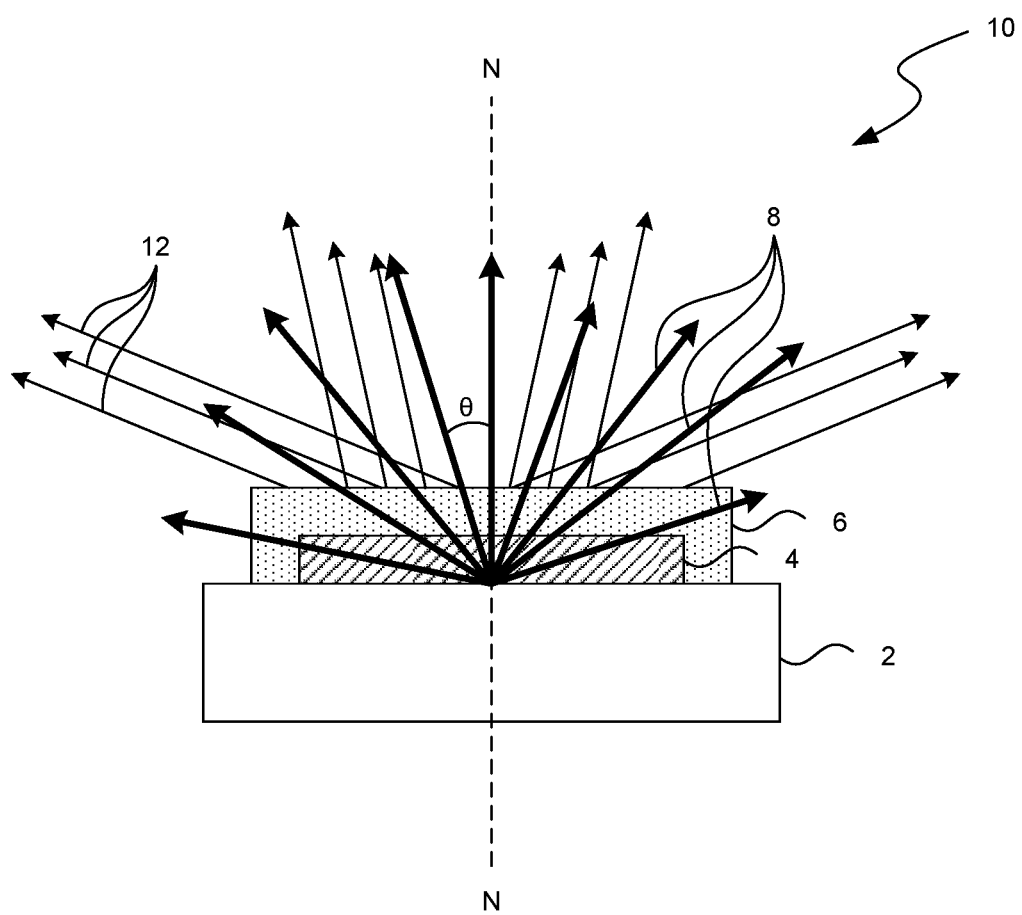
FIG. 1 is a schematic cross-sectional diagram of an SSL device in accordance with the prior art.
Figure 2A:
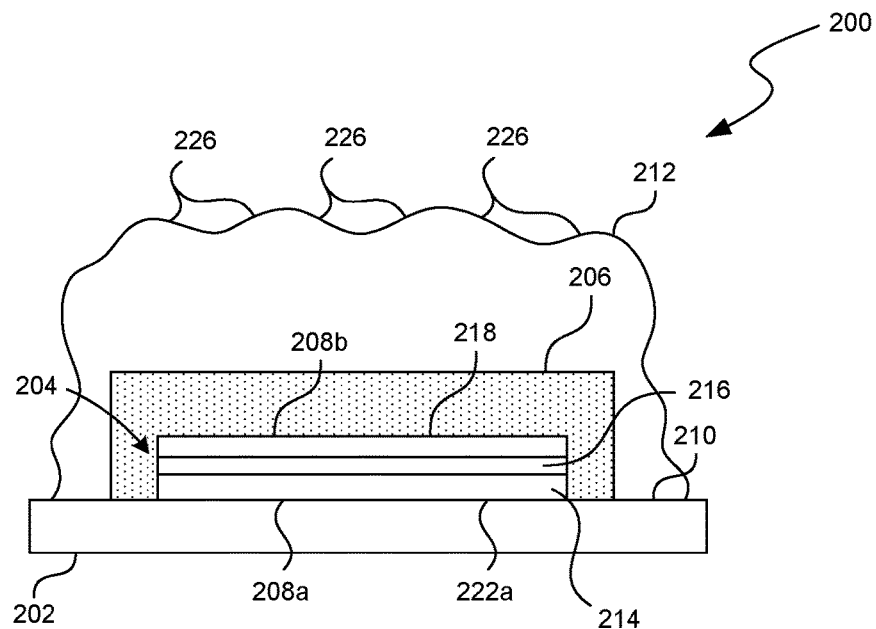
FIG. 2A is a schematic cross-sectional view of an SSL device configured in accordance with an embodiment of the present technology.

FIG. 2A is a schematic cross-sectional view of an SSL device 200 configured in accordance with an embodiment of the present technology. The SSL device 200 can include a support 202 and an SSE 204 attached to a surface 210 of the support 202. The SSL device 200 can further include a converter material 206 positioned over the SSE 204, and a lens 212 positioned over both the SSE 204 and the converter material 206.

As shown in FIG. 2A, the SSE 204 can include a first semiconductor material 214, an active region 216, and a second semiconductor material 218. The first semiconductor material 214 can be a P-type semiconductor material proximate a first side 208a of the SSE 204, such as P-type gallium nitride ("P-GaN"), and the second semiconductor material 218 can be an N-type semiconductor material proximate a second side 208b of the SSE 204, such as N-type gallium nitride ("N-GaN"). This configuration is suitable for SSEs 204 formed on silicon growth substrates and subsequently attached to the support 202. In other embodiments, such as when the SSE 204 is formed on a sapphire growth substrate, the P-GaN and N-GaN are reversed such that the P-GaN is proximate the second side 208b of the SSE 204 and the N-GaN is proximate the first side 208a. The active region 216 can be indium gallium nitride ("InGaN"). The first semiconductor material 214, active region 216, and second semiconductor material 218 can be deposited sequentially using chemical vapor deposition ("CVD"), physical vapor deposition ("PVD"), atomic layer deposition ("ALD"), plating, or other techniques known in the semiconductor fabrication arts. In operation, the SSE 204 can emit a first light in the visible spectrum (e.g., from about 390 nm to about 750 nm), in the infrared spectrum (e.g., from about 1050 nm to about 1550 nm), and/or in other suitable spectra.

As shown in FIG. 2A, the converter material 206 can be placed over at least a portion of the SSE 204 such that light from the SSE 204 irradiates the converter material 206. In the illustrated embodiment, the converter material 206 is positioned over a second side 208b of the SSE 204 and is generally planar. In other embodiments, the converter material 206 has a hemispherical or other suitable shape, and/or is spaced apart from the SSE 204 in other locations of the SSL device 200 that are irradiated by the SSE 204. The irradiated converter material 206 can emit a second light of a certain quality (e.g., color, warmth, intensity, etc.). For example, in one embodiment, the converter material 206 emits yellow light. The second light emitted by the converter material 206 can combine with the first light emitted by the SSE 204 to generate a desired color of light (e.g., white light).

The converter material 206 can include a phosphor containing cerium (III)-doped yttrium aluminum garnet (YAG) at a particular concentration for emitting a range of colors from green to yellow and to red under photoluminescence. In other embodiments, the converter material 206 can include neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium (IV)-doped YAG, dysprosium-doped YAG, samarium-doped YAG, terbium-doped YAG, and/or other suitable wavelength conversion materials. In further embodiments, the converter material 206 can include silicate phosphor, nitrate phosphor, aluminate phosphor and/or other types of salt or ester based phosphors.

As further shown in FIG. 2A, the lens 212 can be positioned over both the converter material 206 and the SSE 204 such that light emitted by the converter material 206 and the SSE 204 passes through the lens 212. The lens 212 can include a transmissive material made from silicone, polymethylmethacrylate (PMMA), resin, or other materials with suitable properties for transmitting the radiation emitted by the SSE 204 and the converter material 206. In selected embodiments, the lens 212 includes an additional converter material (not shown) that emits light at a different frequency than the converter material 206 proximate to (e.g., the closest to) the SSE 204 to generate a desired color of light from the SSL device 200.

Additionally, as shown in FIG. 2A, the lens 212 can include a plurality of diffusion features 226. For example, in the illustrated embodiment, the exterior surface of the lens 212 has a generally irregular or erratic complex curvature that forms the diffusion features 226. In other embodiments, the diffusion features 226 can have different complex curvatures and/or other suitable shapes. The diffusion features 226 can diffract or otherwise change the direction of light emitted by the SSE 204 and the converter material 206 within the lens or as it exits the lens 212 to scatter the light. As described in more detail below, the scattered light can blend and/or otherwise diffuse the different colors of light together such that the SSL device 200 emits a substantially more uniform color compared to a lens with a flat surface or uniformly hemispherical surface.

Figure 2B:
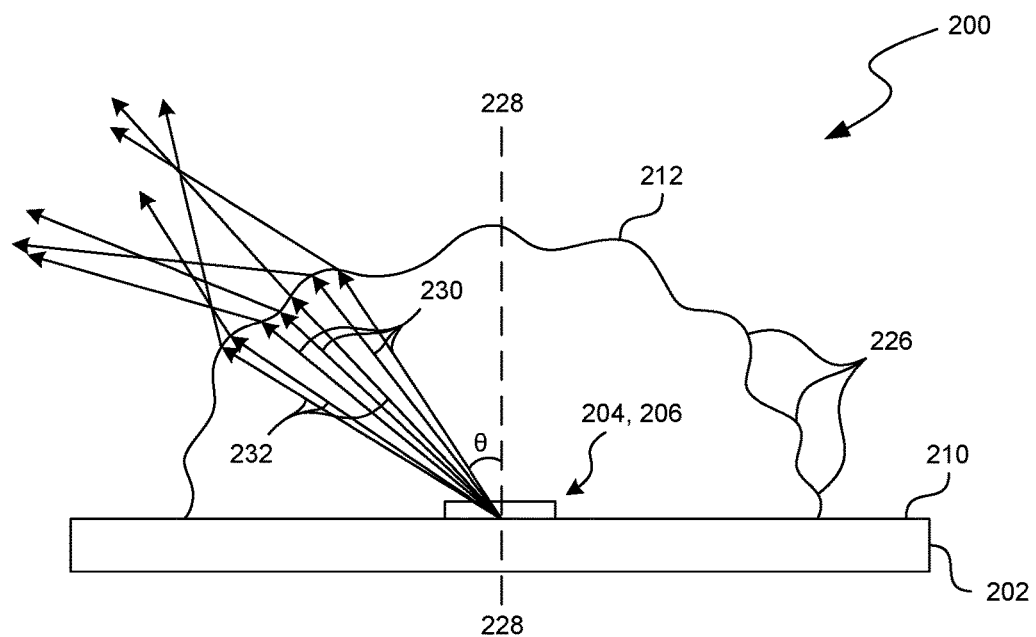
FIG. 2B is an operational view of the SSL device of FIG. 2A illustrating the emission of light from the SSL device.

FIG. 2B is an operational view of the SSL device 200 shown in FIG. 2A that illustrates the emission of light from the SSL device 200. As shown in FIG. 2B, light can be emitted from the SSE 204 along a plurality of first vectors 230 and from the converter material 206 along a plurality of second vectors 232. For clarity, FIG. 2B shows only a portion of the light emitted from the SSL device 200. The first and second vectors 230 and 232 can be represented as projecting generally radially from the SSE 204 and the converter material 206, respectively, as if they originated from a point source. In operation, the first and second vectors 230 and 232 project radially from all points across the face of the SSE 204. In the embodiment shown in FIG. 2B, for example, the SSE 204 and the converter material 206 can emit the first and second vectors 230 and 232 radially across a viewing plane of approximately 180°, stopping at the surface 210 of the support 202. In other embodiments, the support 202 can be configured such that viewing plane is wider or narrower.

As shown in FIG. 2B, the lens 212 can be sized large enough relative to the SSE 204 such that the SSE 204 functions at least generally as a point source. When the SSE 204 operates as a point source, the lens 212 can have a generally circular base portion and at the surface 210 of the support 202 that corresponds to the radial projection of the light from the SSE 204. In other embodiments, such as when vertical height is a constraint, the lens 212 can be smaller with respect to the SSE 204. The base of such a smaller lens 212 can have a shape that generally corresponds to the shape of the SSE 204. In other embodiments, the smaller lens 212 can have a shape that does not correspond to the shape of the SSE 204.

As further shown in FIG. 2B, each first vector 230 projects away from an axis 228 (i.e., an axis normal to the support 202) at an emission angle θ. The axis 228 corresponds with 0° such that the emission angle θ shown in FIG. 2B can range from vertical (0°) to horizontal (90° and −90°).

First vectors 230 having larger emission angles θ travel longer paths through the converter material 206. As light from the SSE 204 travels through the converter material 206, the converter material 206 absorbs some of the light and generates light of a different color along the second vectors 232. Thus, larger emission angles θ increase the light (e.g., yellow light) emitted by the converter material 206 along the second vectors 232. Additionally, the converter material 206 scatters light from the SSE 204. This can further increase the path length that light from the SSE 204 travels through the converter material 206, which increases the light absorbed by the converter material 206 and decreases the light (e.g., blue light) emitted by the SSE 204. Thus, the SSL device 200 emits more of a first color of light (e.g., blue light) from the SSE 204 along the first vectors 230 at a central portion of the SSL device 200 and more of a second color of light (e.g., yellow light) from the converter material 206 along the second vectors 232 at peripheral portions of the SSL device 200.

To mitigate such color nonuniformity, the diffusion features 226 of the lens 212 can diffract or otherwise change the direction of light from the first and second vectors 230 and 232 to other vectors that intersect and blend together as they exit the lens 212. The diffusion features 226 can accordingly scatter light along irregular or erratic vectors at the surface of the lens 212. For example, the diffusion features 226 can be configured at different angles relative to the SSE 204 and/or the substrate 202 such that light along the first vectors 230 with a higher emission angles θdiffract or otherwise change direction toward the axis 228 and intersect with light from the second vectors 232 and/or first vectors 230 with lower emission angles θ. As light from the first and second vectors 230 and 232 intersect, their respective colors can combine to generate a generally uniform color across the SSL device 200.

In the embodiment illustrated in FIG. 2B, the diffusion features 226 of the lens 212 diffract or otherwise change the direction of the first and second vectors 230 and 232 in random, irregular, or generally erratic directions. In other embodiments, the lens 212 can change the direction of light such that light from the first and second vectors 230 and 232 intersects in a particular pattern to provide a desired light distribution. For example, the diffusion features 226 of the lens 212 can be configured to collimate the light emitted by the SSL device 200, project the light emitted by the SSL device 200 at a wide angle (e.g., toward the periphery of the SSL device 200), and/or emit light in other suitable light distributions.

Figure 3:
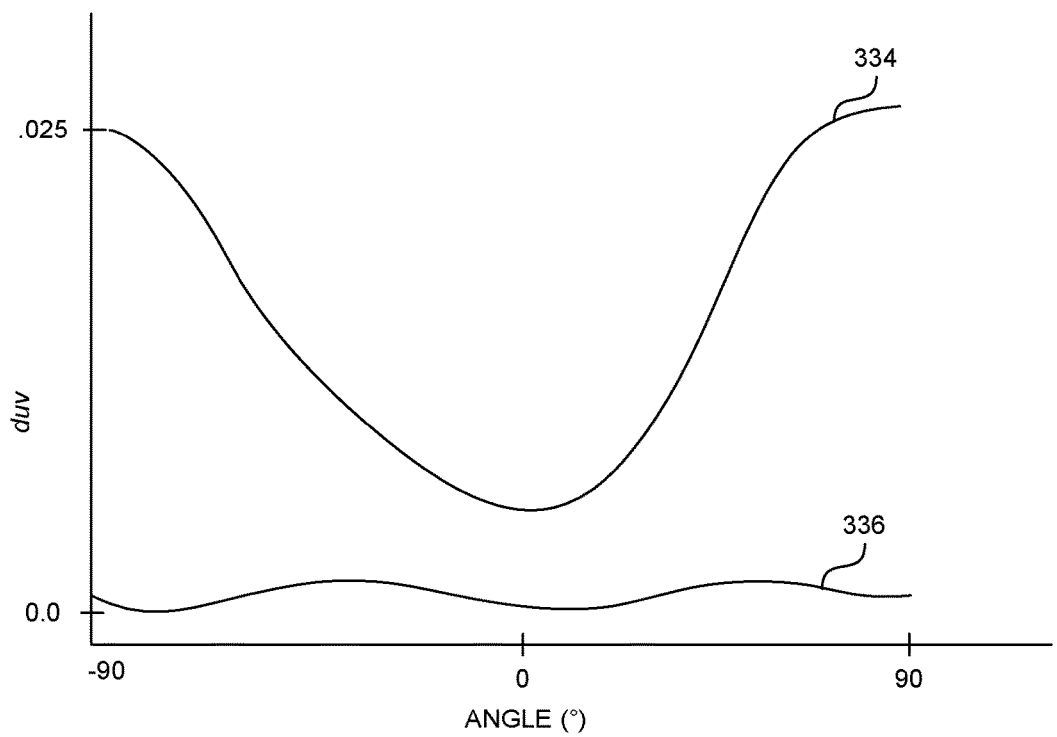
FIG. 3 is a graph showing the relationship between emission angles and color variations across SSL devices.

FIG. 3 is a graph showing the relationship between emission angles θ and color variations duv across SSL devices. The graph includes a first curve 334 that illustrates the color variation across a conventional SSL device. The first curve 334 shows that increasing the emission angle θ varies the color of light emitted across the conventional SSL device. As a result, the peripheral portions of the conventional SSL device emit more light (e.g., yellow light) from the converter material, while the central portion of the conventional SSL device emits more light (e.g., blue light) from the SSE. Accordingly, the conventional SSL device emits a nonuniform color of light.

The graph of FIG. 3 also has a second curve 336 that illustrates the color variation across an SSL device configured in accordance with selected embodiments of the present technology (e.g., the SSL device 200 described above with reference to FIGS. 2A and 2B). As shown in FIG. 3, the second curve 336 is generally flat irrespective of variations in the emission angle θ. As described above, diffusion features of a lens (e.g., the diffusion features 226 of the lens 212 shown in FIGS. 2A and 2B) can diffract and blend light as it exits the lens to mitigate color variance caused by the emission angle θ. Accordingly, many embodiments of SSL devices configured in accordance with the present technology are expected to provide superior color uniformity across the viewing plane.

Figure 4:
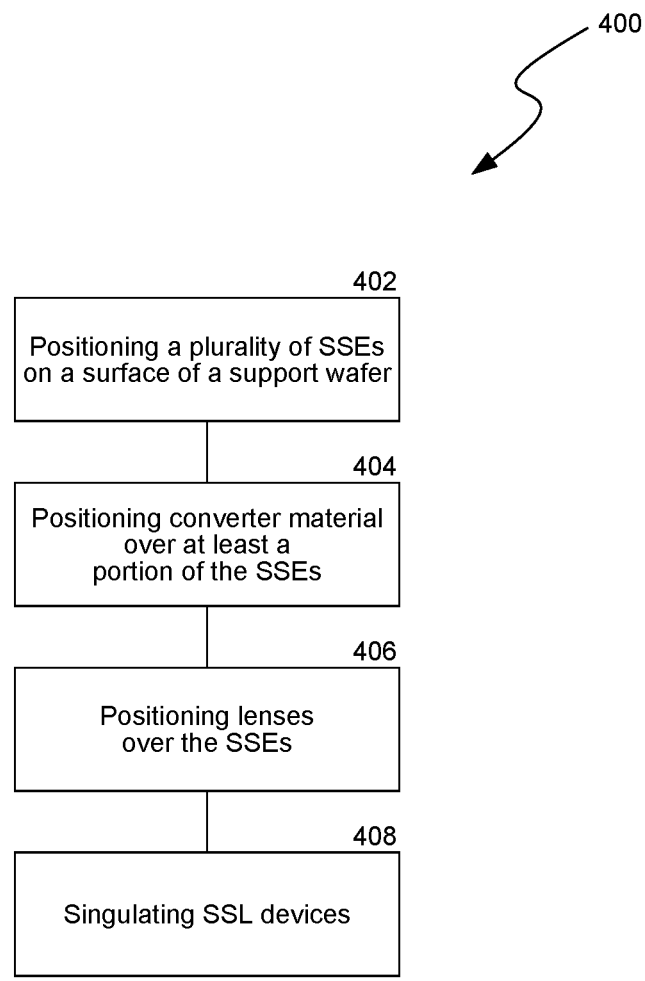
FIG. 4 is a flow chart showing a method of fabricating SSL devices in accordance with an embodiment of the present technology.

FIG. 4 is a flow chart of a method 400 for fabricating SSL devices in accordance with an embodiment of the present technology. The method 400 can include positioning SSEs on a surface of a support wafer (block 402). The SSEs and the support wafer can be generally similar to the SSE 204 and the support 202 described above with reference to FIGS. 2A and 2B. The SSEs can be positioned on the support wafer using surface mounting and/or other suitable methods for attaching SSEs on supports. In other embodiments, the support wafer can comprise a material that encourages epitaxial growth such that the SSEs can be formed directly on the support wafer.

The method 400 can further include positioning a converter material over each of the SSEs (block 404). The converter material can be phosphor and/or other converter materials generally similar to the converter material 206 described with reference to FIG. 2A. The converter material can be placed over the SSEs using CVD, PVD, and/or other suitable methods for depositing converter material on the SSEs. The converter material may be positioned anywhere where light from the corresponding SSE can irradiate energized particles (e.g., electrons and/or photons) in the converter material. In selected embodiments, the converter material can be applied in discrete sections over individual SSEs.

The method 400 can continue by positioning a lens over one or more of the SSEs (block 406). In several embodiments, the lenses can be formed over the SSEs. For example, during overmolding, a mold can be filled with a lens material (e.g., silicone, epoxy, and/or another suitably transparent lens material) and placed over at least one SSE such that the lens material encapsulates the SSE and the corresponding converter material. The mold can be compressed, heated, and/or otherwise processed to harden the lens material and attach the lens to the support wafer. In other embodiments, the lens is injection molded over one or more SSEs by placing a mold over the SSE(s) and injecting the lens material into the mold at elevated temperatures and pressures. In further embodiments, the lens is formed separately from the SSEs, placed over the SSEs, and attached to the support wafer. Once the lenses are positioned over the SSEs and the converter material, the method 400 can include singulating individual SSL devices between the lenses (block 408). In selected embodiments, the SSEs are singulated before the lenses are positioned over the SSEs. In other embodiments, the SSEs are singulated even before the converter material is deposited on the SSEs. The singulated SSL devices can emit a substantially uniform color of light.

Figure 5A:
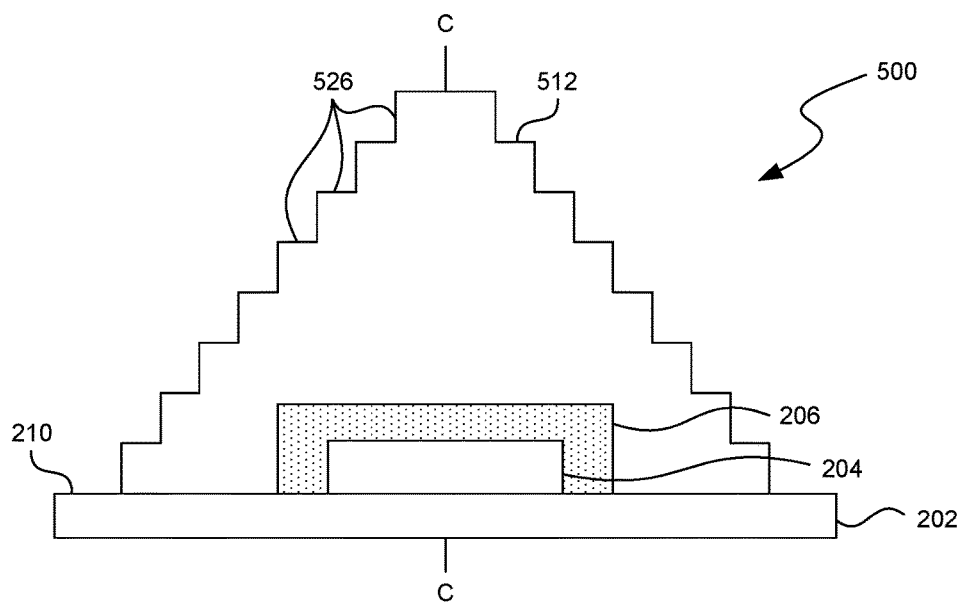
FIG. 5A is a schematic cross-sectional view of an SSL device configured in accordance with an embodiment of the present technology.
Figure 5B:
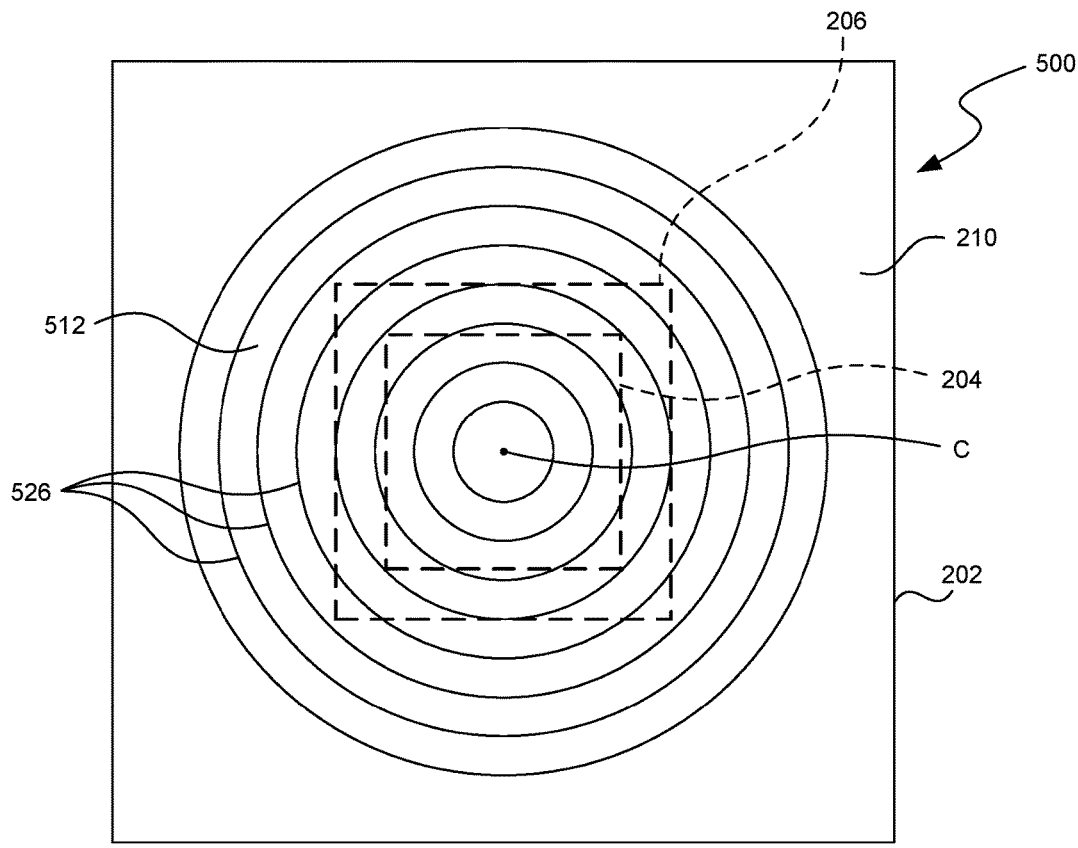
FIG. 5B is a top plan view of the SSL device of FIG. 5A.

FIG. 5A is a schematic cross-sectional view of an SSL device 500 configured in accordance with an additional embodiment of the present technology, and FIG. 5B is a top plan view of the SSL device 500. Several features of the SSL device 500 are generally similar to the features of the SSL device 200 shown in FIGS. 2A and 2B. For example, the SSL device 500 includes the support 202, the SSE 204, and the converter material 206. In the embodiment illustrated in FIGS. 5A and 5B, the SSL device 500 includes a lens 512 that has diffusion features 526 that are symmetric relative to a central axis C-C. As shown in FIG. 5A, the diffusion features 526 can be concentric shoulders, steps or ridges in the lens 512. In other embodiments, the lens 512 can include more or less ridges and/or can have other shapes symmetric with respect to the central axis C-C. Similar to the diffusion features 226 shown in FIGS. 2A and 2B, the diffusion features 526 of the SSL device 500 change the direction of light as it exits the lens 512 such that light emitted from the SSE 204 intersects with itself and light emitted by the converter material 206. Accordingly, the lens 512 can blend different colors of light from the SSE 204 and the converter material 206 to reduce the color variance across the SSL device 500. Additionally, as shown in FIGS. 5A and 5B, the lens 512 can be large relative to the SSE 204 such that the SSE 204 functions effectively as a point source. Accordingly, as shown in FIG. 5B, the lens 512 can have a generally circular base portion at the surface 210 of the support 202 and a stepped dome-like shape that corresponds to the radial projection of light emitted by the SSE 204.

Figure 6A:
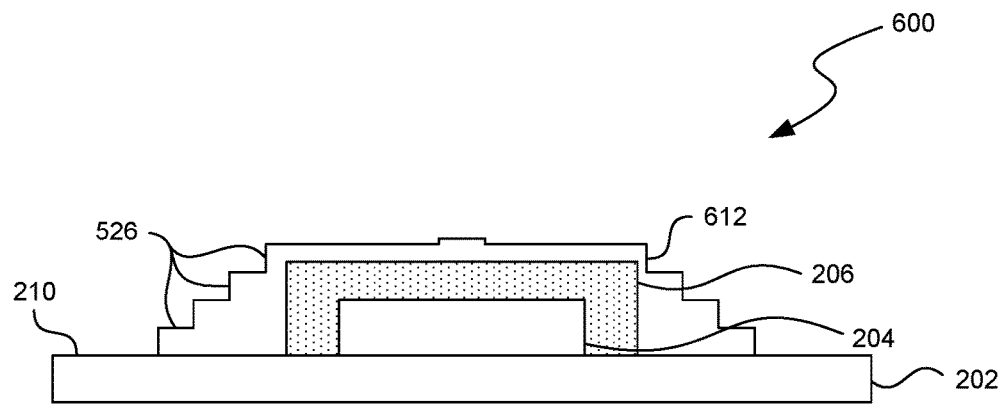
FIG. 6A is a schematic cross-sectional view of an SSL device configured in accordance with another embodiment of the present technology.
Figure 6B:
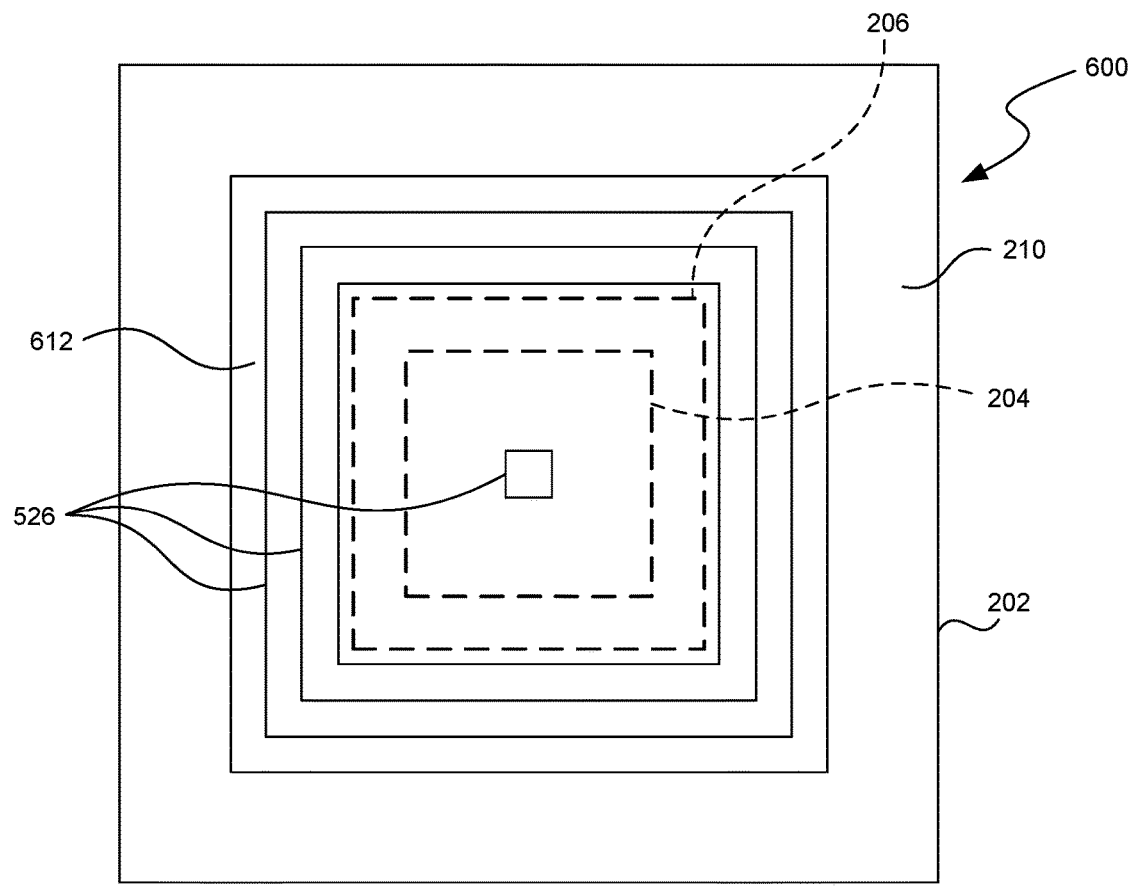
FIG. 6B is a top plan view of the SSL device of FIG. 6A.

FIGS. 6A and 6B are a schematic cross-sectional view and a top plan view, respectively of an SSL device 600 in accordance with another embodiment of the present technology. Several features of the SSL device 600 are generally similar to the features of the SSL device 500 shown in FIGS. 5A and 5B. For example, the SSL device 600 includes the concentric ridges that form the diffusion features 526. The SSL device 600 includes a lens 612 shaped generally similar to the shape of the SSE 204. In the embodiment illustrated in FIG. 6B, for example, the SSE 204 has a rectangular shape and the lens 612 has a corresponding rectangular shape. In other embodiments, the lens 612 has a different shape (e.g., square, oval) corresponding to the shape of the SSE 204. The complimentary shape of the lens 612 allows the lens 612 to be smaller than domed or hemispherical lenses. The smaller lens 612 shown in FIG. 6 can be used in applications with space constraints and/or when the size of the SSE 204 requires the lens to have a low vertical profile (e.g., long lights).

Figure 7A:
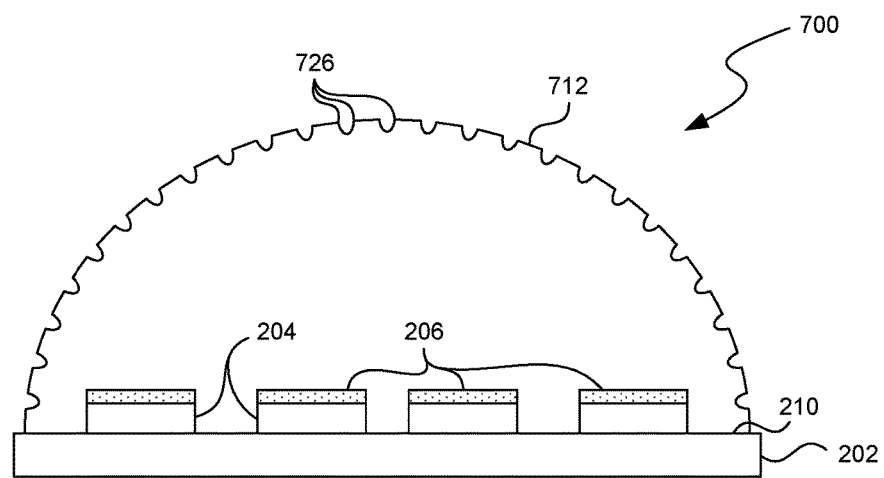
FIG. 7A is a schematic cross-sectional view of an SSL device.
Figure 7B:
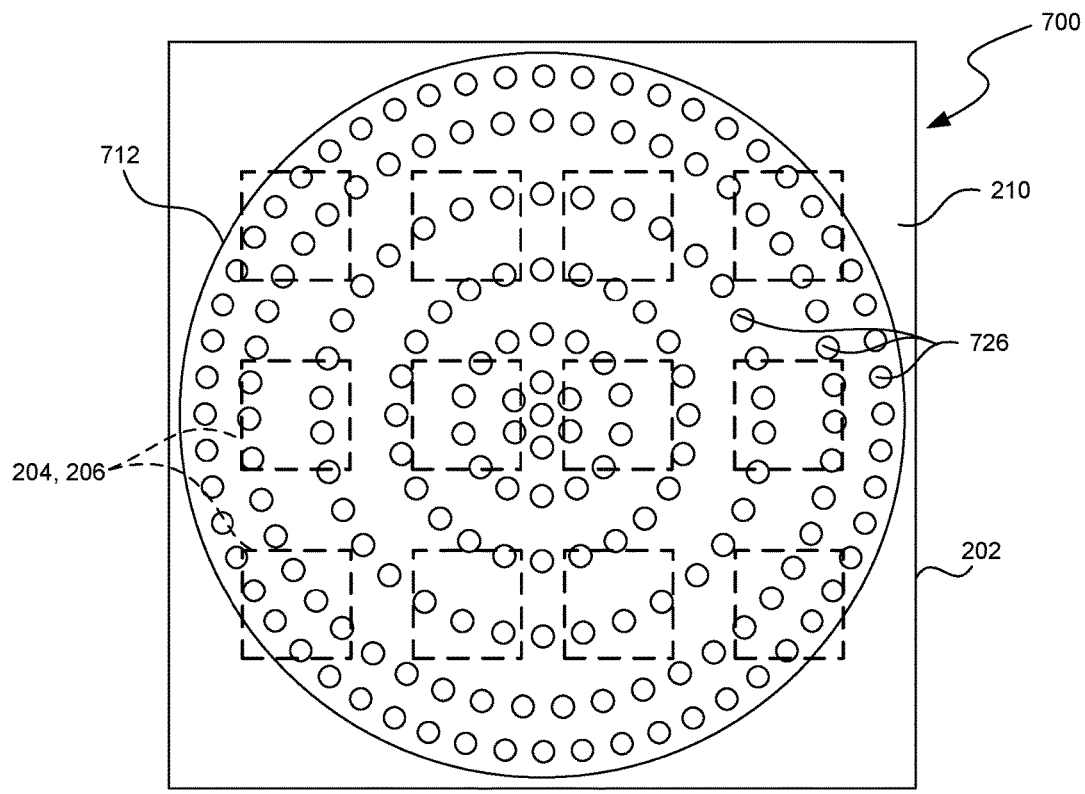
FIGS. 7B and 7C are top plan views of the SSL device of FIG. 7A configured in accordance with further embodiments of the present technology.
Figure 7C:
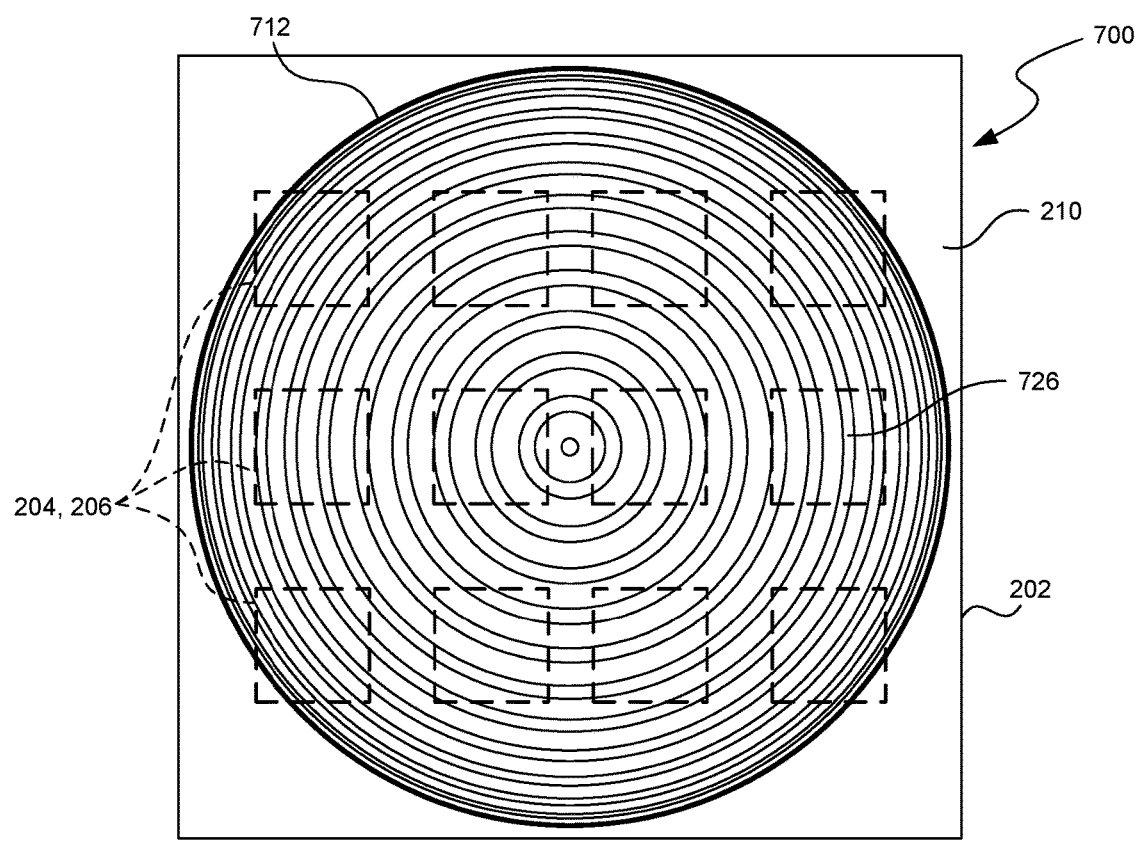

FIG. 7A is a schematic cross-sectional view of an SSL device 700 in accordance with yet another embodiment of the present technology, and FIGS. 7B and 7C are top plan views of the SSL device 700 of FIG. 7A. Several features of the SSL device 700 are generally similar to the features of the SSL devices 200, 500 and 600 shown in FIGS. 2A, 2B, 5A-6B, and are accordingly not described in detail below. As shown in FIGS. 7A-C, the SSL device 700 can include a lens 712 having a plurality of diffusion features 726 in the form of depressions. For example, the diffusion features 726 can be dimples as shown in FIG. 7B and/or concentric grooves as shown in FIG. 7C. In other embodiments, the diffusion features 726 can be other suitable depressions and/or the depressions can change over different portions of the lens 712. Similar to the lenses described above, the diffusion features 726 of the lens 712 shown in FIG. 7A-C can scatter light as it exits the lens 712 to blend different colors of light into a substantially uniform color across the SSL device 700.

As further shown in FIGS. 7A-C, the lens 712 can be positioned over a plurality of SSEs 204 at the surface 210 of the support 202. Referring to FIG. 7A, the converter material 206 can be placed on a front side of each SSE 204 in discrete segments (e.g., wafer level converter material 206). In other embodiments, the converter material 206 can cover more surfaces of the SSEs 204. In further embodiments, the converter material 206 can be deposited over the plurality of SSEs 204 in a single layer. In still further embodiments, some of the SSEs 204 may be exposed rather than covered by the converter material 206. For example, the SSEs 204 at the peripheral portion of the SSL device 700 may not be covered with the converter material 206 such that light emitted from the SSEs at the side of the SSL device 700 is not altered by the converter material 206. In additional embodiments, the converter material 206 can be spaced apart from the SSE 204 in a location that is still irradiated by the SSE 204.

In the embodiment shown in FIGS. 7A-7C, the lens 712 has a hemispherical shape and is large enough that the SSEs 204 act effectively as point sources. In other embodiments, the lens 712 can have a shape that at least generally corresponds to the shape the SSEs 204. For example, the SSEs 204 can be arranged in a rectangular array across the surface 210 of the support 202, and the lens 712 can have a generally rectangular base portion at the surface 210 of the support 202 corresponding to the shape of the array.

Figure 8:
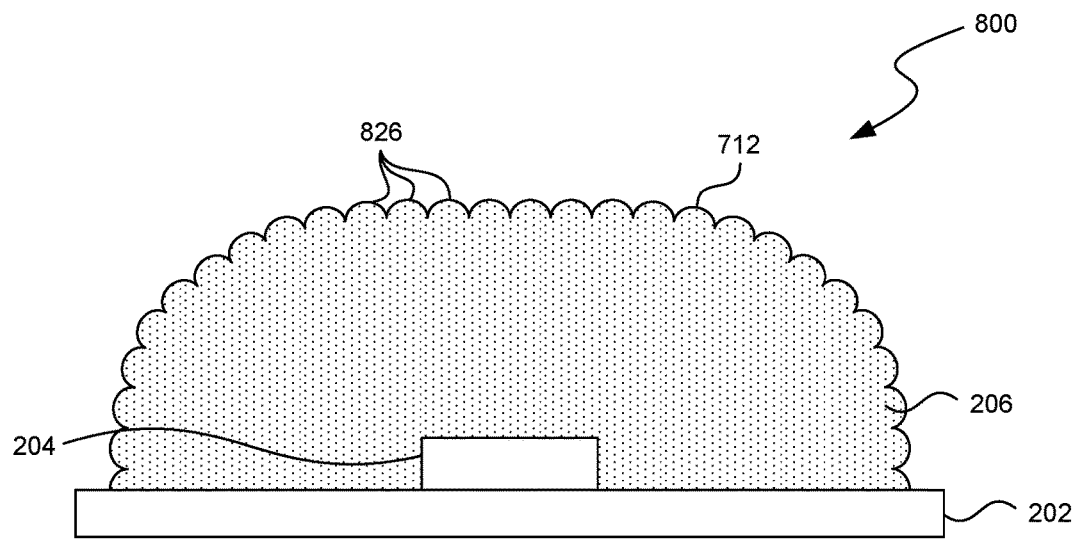
FIG. 8 is a schematic cross-sectional view of an SSL device configured in accordance with yet another embodiment of the present technology.

FIG. 8 is a schematic cross-sectional view of an SSL device 800 in accordance with a further embodiment of the present technology. Several features of the SSL device 800 are generally similar to the features of the SSL devices described above. For example, as shown in FIG. 8, the SSL device 800 can include a lens 812 that has a plurality of protrusions that form a plurality of diffusion features 826. The diffusion features 826 can change the direction of light as it exits the lens 812 to blend different colors of light together and thereby mitigate the color nonuniformity caused by the emission angle. The SSL device 800 shown in FIG. 8, however, does not include a layer of converter material covering the SSE 204. Rather, the lens 812 can include the converter material 0606. In the embodiment illustrated in FIG. 8, for example, the converter material 206 is distributed throughout the lens 812. In other embodiments, the converter material 206 is localized in specific regions within the lens 812. For example, the converter material 206 can be positioned in a central portion of the lens 812 such that the light emitted from the SSE 204 at the peripheral portions of the lens 812 is not altered by the converter material 206. In other embodiments, the lens 812 can include a plurality of different converter materials 206 localized in specific regions within the lens 812 to emit light with different wavelengths.

Figure 9:
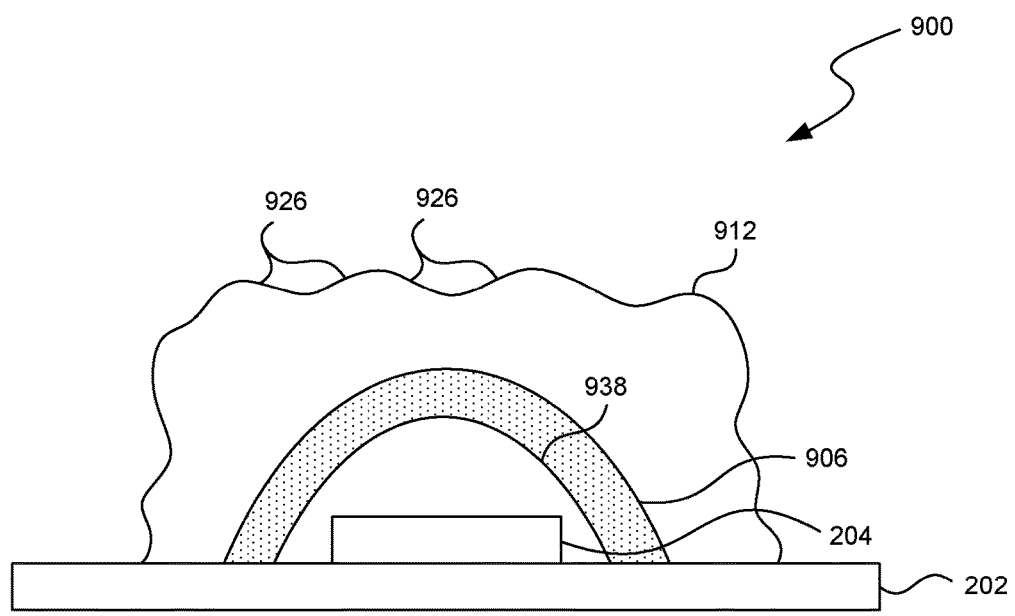
FIG. 9 is a schematic cross-sectional view of an SSL device configured in accordance with an additional embodiment of the present technology.

FIG. 9 is a schematic cross-sectional view of an SSL device 900 configured in accordance with an additional embodiment of the present technology. Several features of the SSL device 900 are generally similar to the features of the SSL devices shown above. The SSL device 900, however, includes two lenses. As shown in FIG. 9, a first lens 938 can be over the SSE 204 and a converter material 906 can be on the first lens 938. The converter material 906 can be at least generally similar to the converter material 206 described above with reference to FIGS. 2A and 5A-7C. As further shown in FIG. 9, a second lens 912 can be positioned over and/or around the first lens 938 and the converter material 906. The second lens 912 can be at least generally similar to the lenses having diffusion features described above with reference to FIGS. 2A, 2B and 5A-8. For example, the second lens 912 can have a plurality of irregular diffusion features 926 that scatter light as it exits the second lens 912 to mitigate color variance caused by the emission angle. In selected embodiments, the second lens 912 can be used to retrofit an existing SSL device that includes the first lens 938 to increase the color uniformity of the existing SSL device.

From the foregoing, it will be appreciated that specific embodiments of the technology have been described herein for purposes of illustration, but that various modifications may be made without deviating from the disclosure. For example, the SSL devices shown in FIGS. 2A and 5A-7C include converter material 206 having a generally rectangular cross-sectional shape. However, in other embodiments, the converter material 206 can have a different cross-sectional shape (e.g., semicircular, irregular) or be incorporated into the lenses. Additionally, lenses in accordance with the present technology can have different shapes than those shown in the Figures. For example, a lens can have any shape that changes the direction of the light as it exits the lens to blend different colors of light together. Certain aspects of the new technology described in the context of particular embodiments may be combined or eliminated in other embodiments. For example, the SSL devices shown above can include both a converter material over an SSE as shown in FIGS. 2A, 5A-7C and 9 and a second converter material distributed throughout a lens as shown in FIG. 8. Additionally, while advantages associated with certain embodiments of the new technology have been described in the context of those embodiments, other embodiments may also exhibit such advantages, but not all of the embodiments within the scope of the technology necessarily exhibit such advantages. Accordingly, the disclosure and associated technology can encompass other embodiments not expressly shown or described herein.

We claim:

1. A method of manufacturing a solid state lighting (SSL) device, comprising:
    positioning a solid state emitter (SSE) on a surface of a support, the support having a centerline axis projecting normal to the surface;
       wherein the solid state emitter has a first side and a second side opposite the second side, the first being at the surface of the support;
    positioning a first lens over the SSE;
    covering at least a portion of the second side of the SSE a with a converter material; and
    positioning a dome-shaped second lens over the SSE, the first lens, and the converter material, the second lens having a plurality of diffusion features,
    wherein, in operation, the SSE emits a first light propagating away from the surface of the support along a plurality of first vectors, the converter material emits a second light propagating along a plurality of second vectors, and wherein the plurality of diffusion features are configured to change the direction of the first light and the second light propagating along the first and second vectors, respectively, such that the first light and the second light blend together as they exit the second lens,
    wherein an exterior surface of the second lens has an irregular or erratic complex curvature and the diffusion features are formed in a random pattern, and
    wherein the diffusion features are configured at different angles relative to the SSE such that the second propagating light propagating along the second vectors at an emission angle $\theta$ changes direction away from the center line axis and intersects with the second light propagating along the second vectors having an emission angle greater than $\theta$ and with the first light propagating along the first vectors away from the center line axis.

2. The method of claim 1 wherein positioning the second lens comprises at least one of injection molding and over-molding the second lens over the SSE, the first lens, and the converter material.

3. The method of claim 1 wherein positioning the second lens comprises:
    forming the second lens separately from the SSE; and
    attaching the second lens on the surface of the support after the second lens is formed.

4. The method of claim 1 wherein positioning the second lens comprises:
    sizing the second lens large enough relative to the SSE such that the SSE functions effectively as a point source; and
    forming a base portion of the second lens, the base portion being proximate to the surface of the support, wherein the base portion has a generally circular shape.

5. The method of claim 1 wherein positioning the second lens comprises:
    forming a base portion of the second lens, the base portion being proximate to the surface of the support, wherein the base portion has a shape at least generally corresponding to a shape of the SSE at the surface of the support.

* * * * *